United States Patent
Ho

(10) Patent No.: US 7,494,382 B2
(45) Date of Patent: Feb. 24, 2009

(54) METHOD AND APPARATUS FOR POSITIONING A PRINTED CIRCUIT BOARD IN A CIRCUIT BOARD PANEL

(75) Inventor: Chin Wei Ho, Taoyuan (TW)

(73) Assignee: HTC Corporation, Taoyuan County (TW)

( * ) Notice: Subject to any disclaimer, the term of this patent is extended or adjusted under 35 U.S.C. 154(b) by 0 days.

(21) Appl. No.: 11/564,966

(22) Filed: Nov. 30, 2006

(65) Prior Publication Data

US 2007/0128928 A1     Jun. 7, 2007

(30) Foreign Application Priority Data

Dec. 7, 2005    (TW)  ............................ 94143187 A

(51) Int. Cl.
*H01R 24/00* (2006.01)
(52) U.S. Cl. ..................................... 439/633
(58) Field of Classification Search ............... 439/677, 439/680, 681, 633, 374, 350; 29/840; 174/255; 361/801
See application file for complete search history.

(56) References Cited

U.S. PATENT DOCUMENTS

| | | | | |
|---|---|---|---|---|
| 4,307,927 A | * | 12/1981 | Mollman | .................... 439/681 |
| 4,695,112 A | * | 9/1987 | Maston et al. | ............... 439/350 |
| 4,699,593 A | * | 10/1987 | Grabbe et al. | .................. 439/71 |
| 4,925,400 A | * | 5/1990 | Blair et al. | .................... 439/374 |
| 5,387,132 A | * | 2/1995 | Sarver et al. | ................. 439/633 |
| 5,866,852 A | * | 2/1999 | Benz et al. | .................... 174/255 |
| 6,338,194 B1 | | 1/2002 | Benz et al. | |
| 6,368,146 B2 | * | 4/2002 | Abbott | ........................ 439/489 |
| 7,032,298 B2 | * | 4/2006 | Sin | .............................. 29/739 |
| 2003/0029034 A1 | | 2/2003 | Chou | |
| 2005/0016897 A1 | | 1/2005 | Cho et al. | |

FOREIGN PATENT DOCUMENTS

| | | |
|---|---|---|
| EP | 11307905 A | 11/1999 |
| GB | 1015264 | 12/1965 |
| WO | 0199189 A1 | 12/2001 |
| WO | 2004023859 A1 | 3/2004 |

\* cited by examiner

*Primary Examiner*—Chandrika Prasad

(57) ABSTRACT

An alignment structure of individual printed circuit board and method thereof are disclosed. The alignment structure of individual printed circuit board includes a panel body and an assembling part. An aligned part having a geometric feature is disposed on an inner side of the panel body. The assembling part coupled with an individual printed circuit board is similar to the geometric feature of the aligned part so that the individual printed circuit board is combined with the panel body.

9 Claims, 3 Drawing Sheets

METHOD AND APPARATUS FOR POSITIONING A PRINTED CIRCUIT BOARD IN A CIRCUIT BOARD PANEL

RELATED APPLICATIONS

The present application is based on, and claims priority from, Taiwan Application Serial Number 94143187, filed Dec. 7, 2005, the disclosure of which is hereby incorporated by reference herein in its entirety.

BACKGROUND

1. Field of Invention

The present invention relates to an alignment structure and a method thereof. More particularly, the present invention relates to an alignment structure and a method thereof for an individual printed circuit board to be assembled in a panel in place.

2. Description of Related Art

A printed circuit board (PCB) is obtained by patterning a copper layer on a substrate to form a transmission path between devices according to a predefined layout. PCBs support electronic components for installation and interconnection, which is applied in electronic products for information, communication and consumer electronic industries.

For mass production, PCB manufacturers combine several individual boards into a single panel. FIG. 1 illustrates a conventional PCB panel structure. Each individual board 100a is connected with a PCB panel 100 by a bonding structure 102 which takes the form of V-cut or V-notch.

However, when one or more individual boards fail due to a circuit defect such as an incorrect circuit pattern during the process, the whole panel has to be discarded, which wastes other functional boards and creates pollution.

For the foregoing reasons, there is a need for an improved design capable of fully utilizing remaining functional boards in a panel when a defective board is caused in the panel, so that the problems of resource waste and pollution can be avoided.

SUMMARY

It is therefore an aspect of the present invention to provide an alignment structure for replacing a defective individual board in a panel.

It is another aspect of the present invention to provide an alignment structure for accurately positioning a replaced individual board in a panel.

In accordance with the foregoing and other aspects of the present invention, an alignment structure of an individual printed circuit board is provided which includes a panel body and an assembling part. The panel body has an aligned part on its panel inner edge and the aligned part has a geometric feature. The assembling part is coupled with an individual printed circuit board whose profile is similar to the geometric feature of the aligned part so that the individual printed circuit board is able to be fitted into the panel body correctly.

According to a preferred embodiment, a panel for PCBs includes a plurality of individual printed circuit boards. The assembling part on a board edge of the individual printed circuit boards has several concaves and convexes while the aligned part on the panel inner edge has corresponding structures which are fitted for the assembling parts. The profile match between the assembling part and the aligned part allows the individual board to be combined with the panel body so that the individual board is accurately positioned and constrained in the panel body.

Another aspect of the present invention is a method for replacing and aligning an individual board in a panel. The method for replacing an individual board in a panel includes a step of separating a defective individual board from a first panel and a step of engaging an assembling part of the functional individual board with an aligned part of the first panel.

Specifically, a defective individual board is first separated from a first panel and a functional individual board is separated from a second panel. The functional individual board is then engaged with an aligned part of the first panel by its assembling part. Furthermore, glue may be applied to bond the functional individual board to the first panel.

In conclusion, the alignment structure allows a replacement of a defective individual board in a panel with a functional individual board of another panel and also allows the complete panel to correctly place a component during the component placement process. The present invention saves remaining functional individual boards in a panel and hence reduces cost, and also avoids the pollution incurred due to discarding the whole panel.

It is to be understood that both the foregoing general description and the following detailed description are by examples and are intended to provide further explanation of the invention as claimed.

BRIEF DESCRIPTION OF THE DRAWINGS

These and other features, aspects and advantages of the present invention are better understood with regard to the following description, appended claims and accompanying drawings, wherein:

DESCRIPTION OF THE PREFERRED EMBODIMENTS

Figure 1:
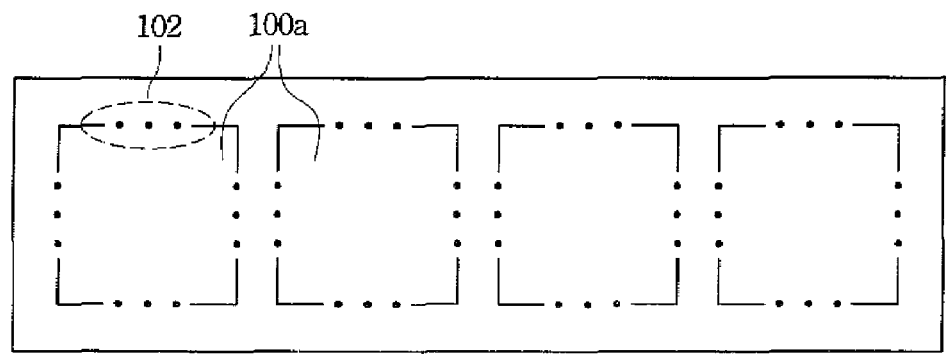
FIG. 1 is a schematic view of a conventional PCB panel structure.

The present invention discloses a panel structure with a geometric feature by which an individual board fits into a panel body. Convenient replacement of individual printed circuit boards in a PCB panel is available and an accurate positioning is also provided. Reference is now made in detail to the present preferred embodiments of the invention, examples of which are illustrated in the accompanying drawings. Wherever possible, the same reference numbers are used in the drawings and the description to refer to the same or like parts.

Figure 2:
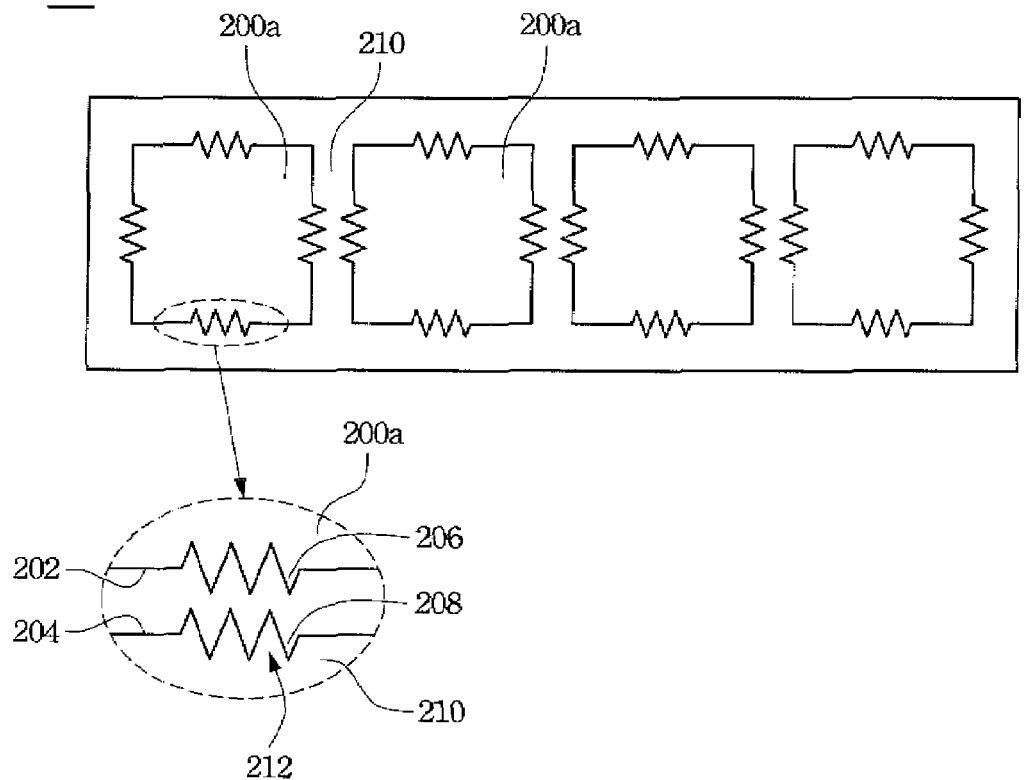
FIG. 2 is a schematic view of a panel structure in accordance with a preferred embodiment of the present invention.

FIG. 2 illustrates a schematic view of a panel structure in accordance with a preferred embodiment of the present invention. The alignment structure includes a panel body 210 and an assembling part 206. The panel body 210 is a frame for integrating several individual printed circuit boards 200a into a single entity, and an aligned part 208 is part of an inner edge 204 of the panel. The aligned part 208 includes a geometric feature 212.

The assembling part 206 is coupled to a board edge 202 of the individual printed circuit board 200a and takes the form similar to the geometric feature 212 of the aligned part 208. That is, the assembling part 206 can be fitted into the aligned part 208 through a complementary profile, so that the individual printed circuit board 200a is accurately positioned in the panel body 210.

In a preferred embodiment, the alignment structure of the present invention is applied to a PCB panel 200 which has four individual printed circuit boards 200a. Preferably, the individual board 200a can be removed from the PCB panel 200 by punching. Specifically, the assembling part 206 is separated from the aligned part 208.

As shown in the figure, the PCB panel 200 includes a panel body 210 and a plurality of individual printed circuit boards 200a connected thereto. The figure also emphasizes the aligned part 208 on the panel inner edge 204 when the individual printed circuit board 200a is separated from the panel body 210. The aligned part 208 has a geometric feature 212, a concave or a convex with a saw-toothed, triangular, wave or irregular profile, showing a curvature variation with respect to the panel inner edge 204 at the border.

A board edge 202 of the individual printed circuit board 200a has an assembling part 206 which renders a curvature variation with respect to the board edge 202 at the border. The assembling part 206 may be a concave or a convex, depending upon the geometric feature 212 of the aligned part 208 subject to the requirement that the aligned part 208 is capable of engagingly matching the profile of the assembling part 206.

For example, when the aligned part 208 is a concave, the assembling part 206 is a convex which fits into the aligned part 208. In the embodiment, both of the aligned part 208 and the assembling part 206 have a plurality of concaves and convexes.

Figure 3:
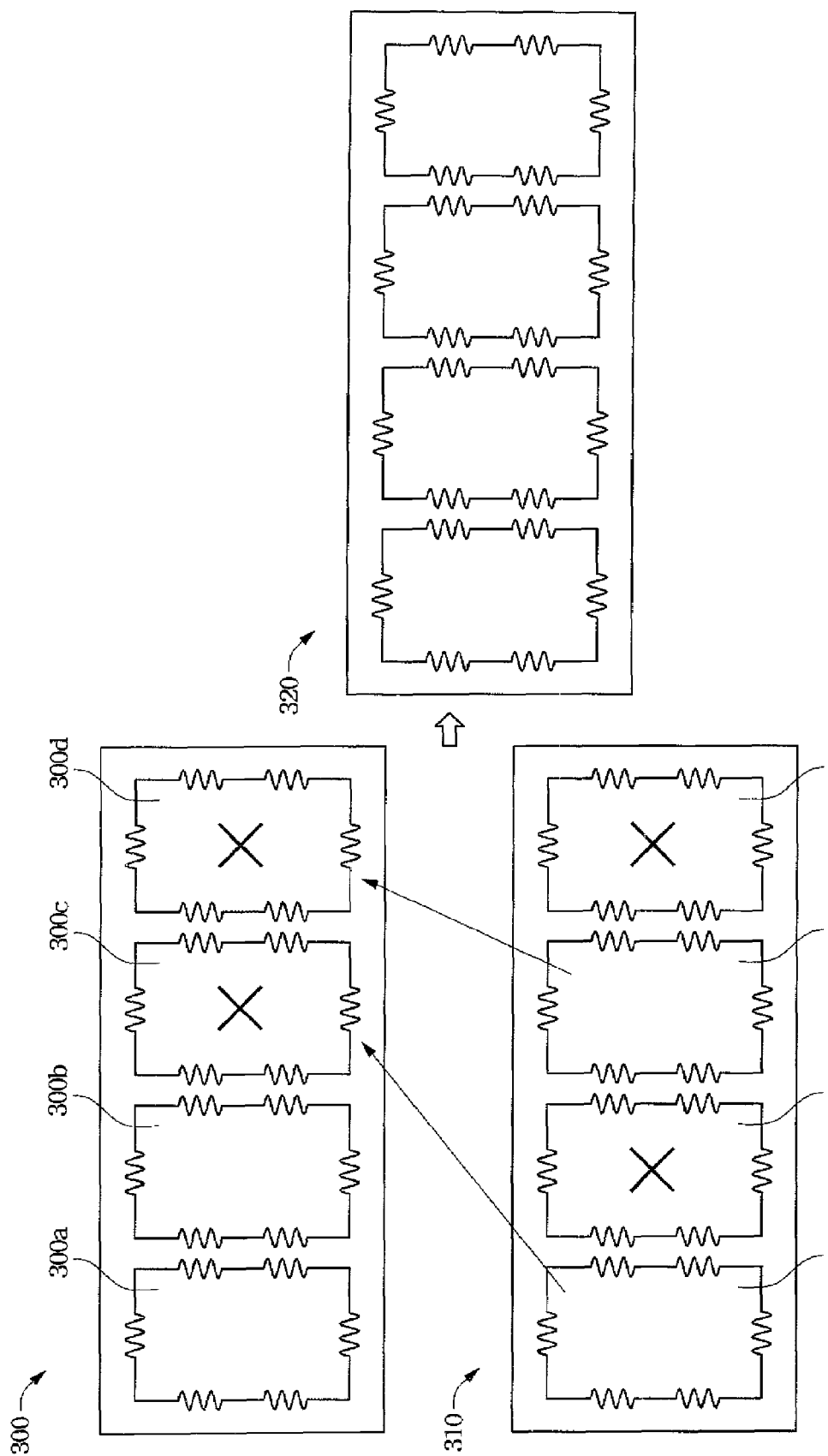
FIG. 3 is a schematic view of replacement of defective individual boards in a panel in accordance with another preferred embodiment of the present invention.

Reference now is made to FIG. 3, which illustrates a schematic view of replacement of defective individual boards in a panel in accordance with another preferred embodiment of the present invention. Individual boards with a symbol 'X' are defective. An example for describing the implementation of replacing individual boards is as follows. A first panel 300 has four individual boards 300a~300d, two of which are defective individual boards 300c and 300d caused by an error in the process, and the other two are functional individual boards 300a and 300b. A second panel 310 includes defective individual boards 310b and 310d and functional individual boards 310a and 310c.

Before a component placement process, the defective individual boards 300c and 300d of the first panel 300 can be removed by punching, as well as done for functional individual boards 310a and 310c of the second panel 310. The functional individual boards 310a and 310c then are put into the spaces which were occupied by the defective individual boards 300c and 300d previously. All assembling parts are correspondingly engaged with the alignment parts.

The functional individual boards 310a and 310c can be firmly bonded to or fixed on the first panel 300 by glue to achieve the replacement of the defective individual boards 300c and 300d. When the replacement is finished, a new complete panel 320 with four functional individual boards 300a, 300b, 310a and 310c is obtained. By the engagement between the alignment part and assembling part, accurate and precise positioning is available, which helps avoid inaccurate placement of components in subsequent process.

It should be noted that profiles of the aligned part and the assembling part are not limited to the embodiment above. Various kinds of shapes are within the scope of the present invention as long as profiles of two parts are capable of being fitted with each other. Generally, a more complicated profile leads to a more accurate fit. Moreover, the number of the assembling part and alignment part can be increased according to needs for a greater precision.

Figure 4:
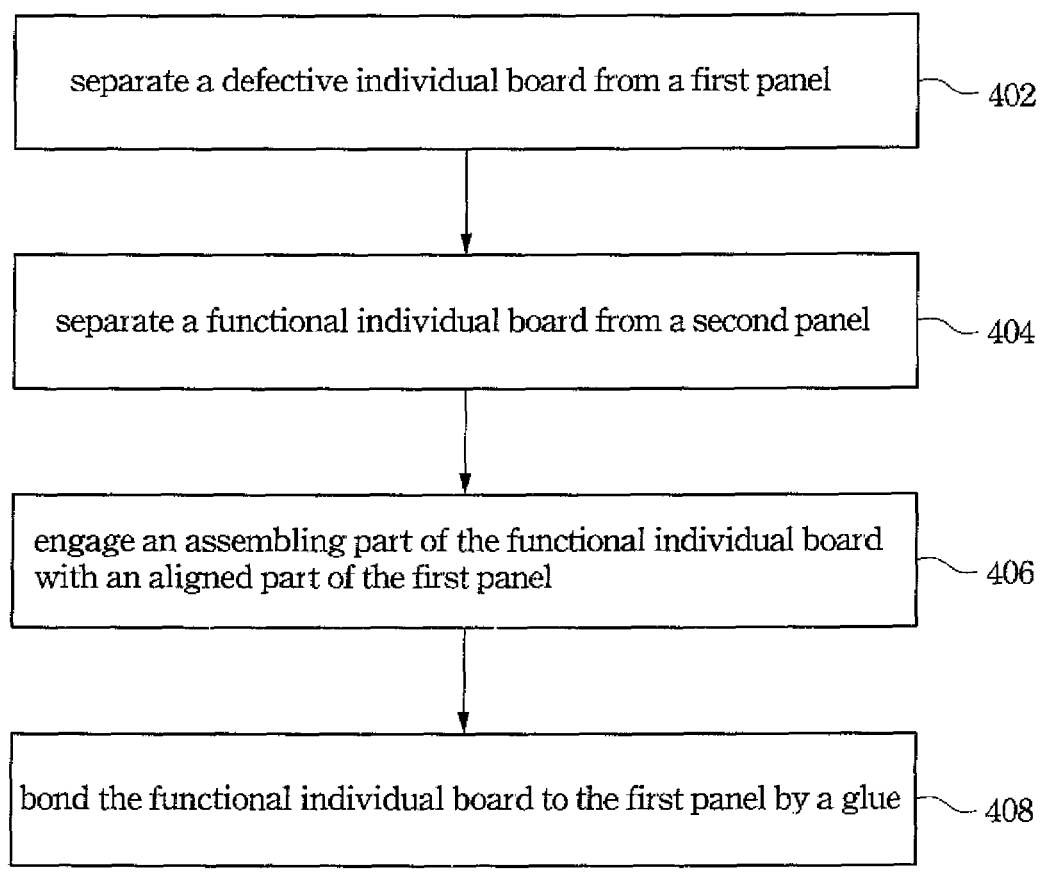
FIG. 4 is a flow chart of replacing and aligning individual boards in a panel in accordance with a preferred embodiment of the present invention.

Reference is now made to FIG. 4, which is a flow chart of replacing and aligning individual boards in a panel in accordance with a preferred embodiment of the present invention. Another aspect of the present invention is a method for placing and aligning an individual board in a panel which is capable of replacing the individual board in the panel by accurate positioning. In a preferred embodiment, the method for replacing an individual board in a panel includes the following steps. In step 402, a defective individual board is separated from a first panel.

In step 404, a functional individual board is separated from a second panel. Each of the individual boards includes an assembling part and each of the panels includes an aligned part for the assembling part to fit into. The individual boards above may be separated from the panel by punching. In step 406, the assembling part of the functional individual board is engaged with the alignment part of the first panel so that the individual board is replaced and positioned in a correct way. The method for replacing further includes a step 408 in which the functional individual board is bonded to the first panel by glue so that the functional individual board can be held firmly.

The present invention has the following advantage. With an aligned part and an assembling part, individual boards in a panel are replaceable in an easier way to fully utilize the whole panel, and accurate positioning of the individual boards is also achieved which avoids inaccuracy in the component placement process due to an inaccurate positioning of the individual board. Therefore, the resource waste in the whole process is lowered significantly for the reasons above and pollution caused from discarding the whole panel is also reduced. The present invention is greatly advantageous to manufacturers in the field.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A printed circuit board panel, comprising:
   a printed circuit board panel body having a plurality of panel inner edges;
   a plurality of alignment parts, each of the alignment parts extending from one of the panel inner edges and having a geometric feature; and
   a plurality of individual printed circuit boards, and
   a plurality of complementary alignment parts, each of the complementary alignment parts coupled with one of the individual printed circuit boards, wherein the complementary alignment parts extend from a board edge of the individual printed circuit board and is similar to the geometric feature of the circuit panel alignment part for fitting the individual printed circuit board to any one of the panel inner edges of the printed circuit board panel body;
   wherein at least one of the individual printed circuit boards is originally formed integral with the printed circuit board panel body and the remaining individual printed circuit boards are bonded to the printed circuit board panel by an adhesive.

2. The printed circuit board panel of claim 1, wherein each alignment part is concave with respect to the panel inner edge and each complementary alignment part is convex with respect to the board edge of the individual printed circuit board.

3. The printed circuit board panel of claim 1, wherein the alignment part is a convex with respect to the panel inner edge and the complementary alignment part is a concave with respect to the board edge of the individual printed circuit board.

4. The printed circuit board panel of claim 1, wherein the geometric feature comprises saw-toothed, triangular or wavy.

5. The printed circuit board panel of claim 1, wherein the geometric feature is irregular.

6. The printed circuit board panel of claim 1, wherein the alignment part is separable from the complementary alignment part by punching.

7. The printed circuit board panel of claim 1, wherein the geometric of the alignment part is different from the panel inner edge.

8. A method for aligning an individual printed circuit board in a printed circuit board panel, comprising:
   punching a first individual printed circuit board from a first printed circuit board panel forming inner edges within the first printed circuit board panel, the inner edges having at least one aligning feature;
   punching a second individual printed circuit board from a second printed circuit board panel, the second individual printed circuit board having a complementary shaped aligning feature disposed on at least one edge thereof; and
   inserting the second individual printed circuit board in the first printed circuit board panel such that the at least one aligning feature of the individual printed circuit board is in alignment with the complementary shaped aligning feature disposed on the inner edges of the first printed circuit board panel;
   wherein at least one of the individual printed circuit boards is originally formed integral with the printed circuit board panel body and the remaining individual printed circuit boards are bonded to the printed circuit board panel by an adhesive.

9. The method of claim 8 further comprising bonding the functional individual printed circuit board to the first printed circuit board panel by an adhesive.

* * * * *